United States Patent
Murakami et al.

(10) Patent No.: US 6,259,294 B1
(45) Date of Patent: Jul. 10, 2001

(54) VARIABLE DELAY CIRCUIT AND DELAY TIME SETTING METHOD THEREFOR

(75) Inventors: Naoki Murakami; Takashi Yamauchi, both of Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/451,811

(22) Filed: Nov. 26, 1999

(30) Foreign Application Priority Data

Nov. 27, 1998 (JP) .................................................. 10-338094

(51) Int. Cl.[7] .................................................... H03H 11/26
(52) U.S. Cl. ............................................ 327/277; 327/271
(58) Field of Search ..................................... 327/271, 277, 327/284, 393, 395, 396, 272, 278, 285, 270

(56) References Cited

U.S. PATENT DOCUMENTS 5,631,593 * 5/1997 Molin ..................................... 327/277

FOREIGN PATENT DOCUMENTS

| 62-120117 | 6/1987 | (JP) | ................................. H03K/5/13 |
| 5-308260 | 11/1993 | (JP) | ................................. H03K/5/13 |
| 8-032421 | 2/1996 | (JP) | ................................. H03K/5/13 |
| 9-046195 | 2/1997 | (JP) | ................................. H03K/5/13 |
| 9-180491 | 7/1997 | (JP) | ................................. G11C/27/02 |
| 10-163822 | 6/1998 | (JP) | ................................. H03K/3/354 |

* cited by examiner

Primary Examiner—Toan Tran
Assistant Examiner—Linh Nguyen
(74) Attorney, Agent, or Firm—Hayes, Soloway, Hennessey, Grossman & Hage PC

(57) ABSTRACT

A variable delay circuit is provided with a plurality of unit delay circuits connected in series. Each of the plurality of unit delay circuit is provided with an inverter and a transistor having a current control electrode connected to an output terminal of the inverter. The transistor generates the first and second delays relating to a signal supplied to another electrode. The second delay is larger than the first delay. The variable delay circuit is also provided with a selection control circuit which selects a signal applied to said another electrode of each of a plurality of the transistors.

11 Claims, 8 Drawing Sheets

| M | C | B | A | D4 | D3 | D2 | D1 |
|---|---|---|---|----|----|----|----|
| 0 | L | L | L | H | H | H | H |
| 1 | L | L | H | H | H | H | L |
| 2 | L | H | L | H | H | L | L |
| 3 | L | H | H | H | L | L | L |
| 4 | H | L | L | L | L | L | L |

H:HIGH LEVEL
L:LOW LEVEL

| FUSE | A |
|---|---|
| CONNECTED | L |
| CUT | H |

| M | B | A | D2 | D1 |
|---|---|---|----|----|
| 0 | L | L | H  | H  |
| 1 | L | H | H  | L  |
| 2 | H | L | L  | H  |
| 3 | H | H | L  | L  |

H:HIGH LEVEL
L:LOW LEVEL

VARIABLE DELAY CIRCUIT AND DELAY TIME SETTING METHOD THEREFOR

BACKGROUND OF THE INVENTION

1. Field of the Invention

The present invention relates to a variable delay circuit built in a semiconductor device and a delay time setting method for the variable delay circuit, and particularly relates to a variable delay circuit having a reduced number of elements and a reduced chip area and a delay time setting method for the variable delay circuit.

2. Description of the Related Art

A conventional variable delay circuit is described in, for example, Japanese Patent Unexamined Application Publication No. 9-46195 (to be referred to as "Publication 9-461951," hereinafter). FIG. 1 is a circuit diagram showing the conventional variable delay circuit described in the Publication 9-46195 and FIG. 2 is a circuit diagram showing the structure of a transfer gate shown in FIG. 1.

In the conventional variable delay circuit described in the Publication 9-46195, (n+1) (where n is an integer equal to 1 or higher) inverters I1, I2, . . . and In+1are connected in series as shown in FIG. 1. The output resistance is almost constant among the inverters I1, I2, . . . and In+1. Transfer gates S1, S2, S3, . . . and Sn and capacitive elements C1, C2, C3, . . . and Cn are connected in series between the nodes of adjacent inverters and a ground potential, respectively. The capacity is almost constant among the capacitive elements C1, C2, C3, . . . and Cn. The variable delay circuit is also provided with a selection circuit section 101 having output terminals D1, D2, D3, and . . . Dn. The output terminals D1, D2, D3, . . . and Dn are connected to the control terminals of the transfer gates S1, S2, S3, . . . and Sn, respectively. A controlling signal (binary code signal) indicating the number of transfer gates S1, S2, S3, . . . and Sn to be simultaneously turned on is inputted to the input terminal of the selection circuit section 101.

Each transfer gate is provided with a P-channel MOS transistor Q103 and an N-channel MOS transistor Q102 as shown in FIG. 2. An inverter IV102 is connected between the control terminal and the gate of the P-channel MOS transistor Q103. The binary signal inputted to the control terminal is, therefore, inputted to the gate of the N-channel MOS transistor Q102 as it is, and inputted to the P-channel MOS transistor Q103 after being inverted. In this way, the on/oft controlling of the P-channel MOS transistor Q103 and the N-channel MOS transistor Q102 is conducted.

In the conventional variable delay circuit constituted as stated above, if the value of n is 3, since output resistances R1, R2, R3 and R4 of the inverters I1, I2, I3 and I4, respectively, are almost constant and the capacities of the capacitive element C1, C2, C3 and C4 are almost constant, delay time Trc determined by a time constant τ=RC is almost constant, as well. The capacity of the capacitive element is set quite small and the output resistance R is set at about 100Ω so as to satisfy the relationship represented by (delay time Trc)<<(propagation delay time Tin of inverter). Thus, the delay time between {(n+1)×Tin} and {(n+1)×Tin+n×Tc} can be arbitrarily adjusted with a delay time Trc as a minimum unit. Although Tc is considered to be defined as the propagation delay time of a capacitive element, Publication 9-46195 makes no mentions thereof.

Nevertheless, the above-stated conventional variable delay circuit is provided with the transfer gates controlling the connection between capacitive elements and the ground respectively in addition to the series connected inverters and the capacitive elements connected between the output terminals of the inverters and the ground potential, respectively. Due to this, enormous number of transfer gate elements are provided in a circuit designed to process address signals, data input signals and the like and requiring many variable delay circuits which function to adjust delay time. As a result, the area of a chip incorporating such variable delay circuits disadvantageously increases.

SUMMARY OF THE INVENTION

It is, therefore, an object of the present invention to provide a delay circuit and a delay time setting method therefor, capable of reducing the number of elements of a product requiring a plurality of unit delay circuits and suppressing a chip area from increasing.

According to one aspect of the present invention, a variable delay circuit comprises a plurality of unit delay circuits connected in series. Each of the plurality of unit delay circuits includes an inverter and a transistor having a current control electrode connected to an output terminal of the inverter. The transistor generates a first delay and a second delay relating to a signal supplied to another electrode. The second delay is larger than the first delay. The variable delay circuit further comprises a selection control circuit which selects a signal applied to the another electrode of each of a plurality of the transistors.

According to the present invention, the capacity of the transistor is varied by switching a signal supplied to the another electrode of the transistor. Therefore, it suffices to provide only the transistors as elements provided between the inverters and the selection control circuit. It is, therefore, possible to greatly reduce the number of elements. It is thereby possible to make a circuit requiring many unit delay circuits small in size. Besides, the stability of the operation of the circuit enhances.

If it is assumed, for example, that the capacity between the gate and back bias of an MOS transistor is Cgb, that between the gate and source thereof is Cgs and that between the gate and drain is Cgd, then it is possible to obtain a time constant τ=R×(Cgb+Cgs+Cgd) from the sum R of the ON resistance and wiring resistance of a CMOS inverter. The capacities Cgs and Cgd can be controlled by switching levels of source and drain potentials to the logic levels of HIGH potential/ LOW potential. To realize the delay time determined by this time constant τ, the variable delay circuit according to the present invention is constituted by extremely small number of elements.

According to another aspect of the present invention, a delay time setting method comprises the steps of: conducting a test for a circuit including the variable delay circuit; setting a delay amount of each of the unit delay circuits based on a result of the test. The later step includes the step of setting switching elements so that different potentials from each other are supplied to two electrodes other than the current control electrode in a unit delay circuit whose delay amount has been set to the first delay and to two electrodes other than the current control electrode in a unit delay circuit whose delay amount has been set to the second delay.

DESCRIPTION OF THE PREFERRED EMBODIMENTS

Figure 1:
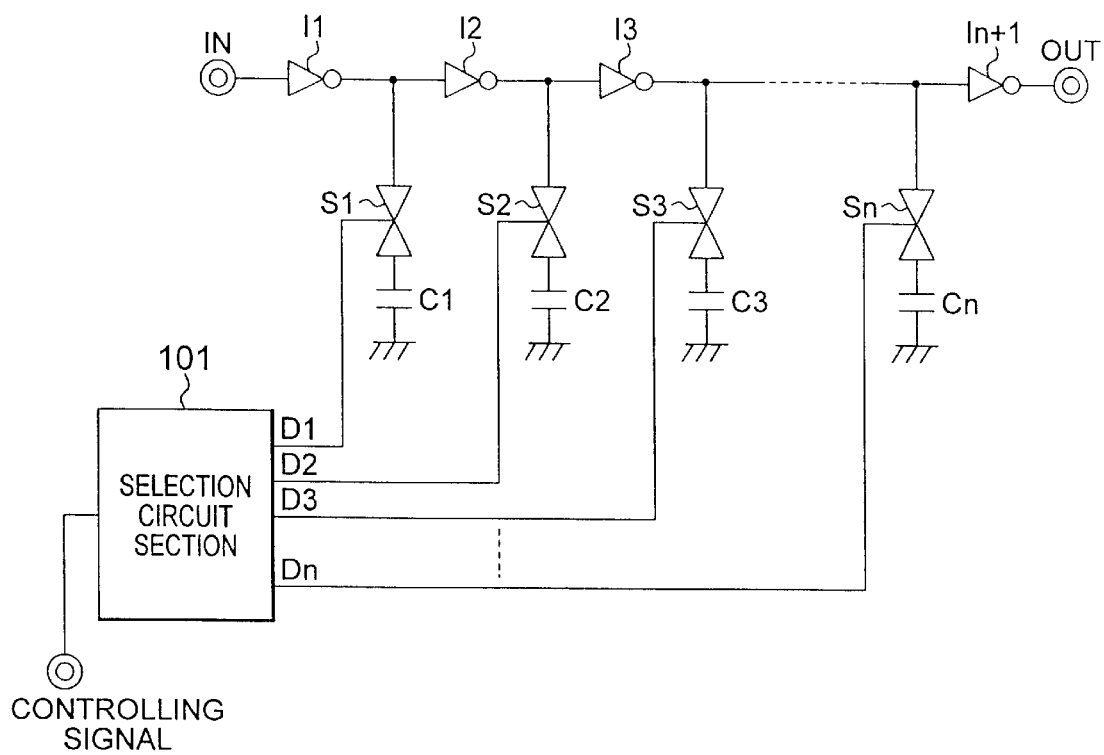
FIG. 1 is a circuit diagram showing a conventional variable delay circuit described in Japanese Patent Unexamined Application Publication No. 9-46195.
Figure 2:
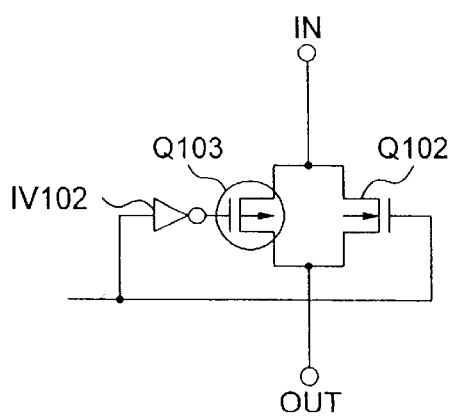
FIG. 2 is a circuit diagram showing the structure of a transfer gate in FIG. 1.
Figure 3:
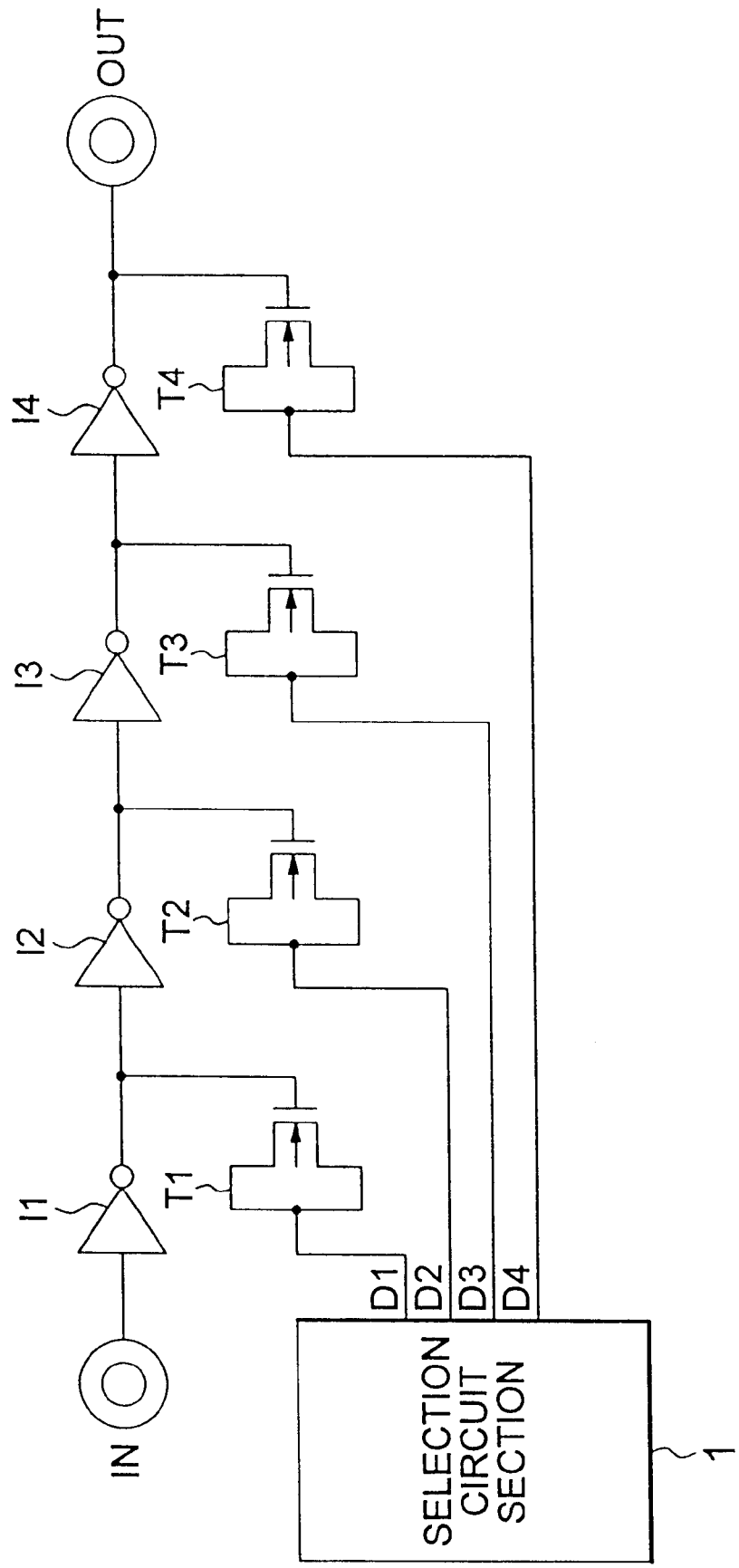
FIG. 3 is a circuit diagram showing a variable delay circuit in the first embodiment according to the present invention.
Figures 4A, 4B:
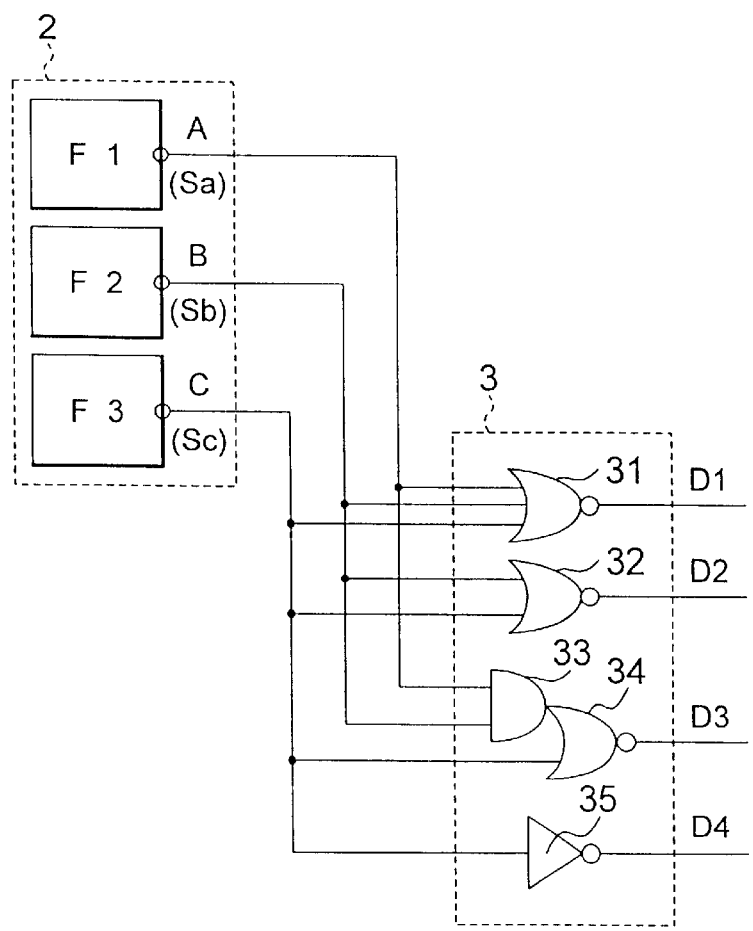
FIG. 4A is a block diagram showing a selection circuit section 1 in FIG. 1.
FIG. 4B shows a truth table for the selection circuit section 1.
Figures 5A, 5B:
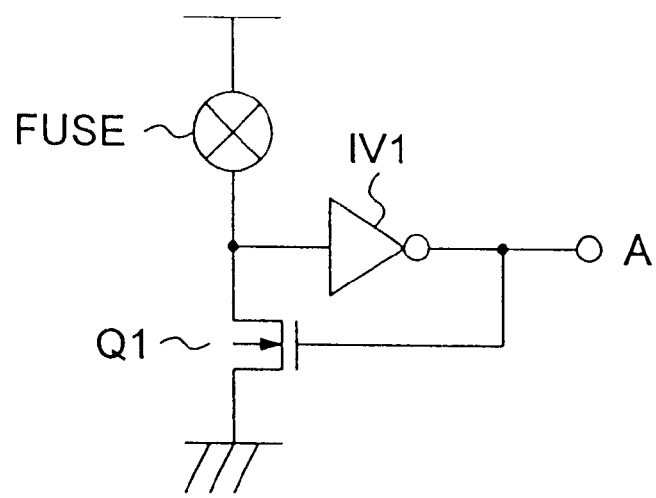
FIG. 5A is a circuit diagram showing an FUSE block F1 in FIG. 2A
FIG. 5B shows a truth table for the FUSE block F1.

Now, the embodiments of the present invention will be concretely described with reference to the accompanying drawings. FIG. 3 is a circuit diagram showing a variable delay circuit in the first embodiment according to the present invention. FIG. 4A is a block diagram showing a selection circuit section 1 shown in FIG. 1 and FIG. 4B shows a truth table for the selection circuit section 1. FIG. 5A is a circuit diagram showing an FUSE block F1 shown in FIG. 2A and FIG. 5B shows a truth value table for the FUSE block F1.

In the first embodiment, four inverters I1, I2, I3 and I4 having mutually equal propagation delay time are connected in series between an input terminal IN and an output terminal OUT. Each of the inverters I1, I2, I3 and I4 consists of, for example/ a CMOS transistor. The gates of N-channel MOS transistors T1, T2, T3 and T4 are connected to the nodes between adjacent inverters, respectively. The sources and drains of the N-channel MOS transistors T1, T2, T3 and T4 are connected in common to nodes, respectively. The variable delay circuit is also provided with a selection circuit section 1 having output terminals D1, D2, D3 and D4. The output terminals D1 to D4 are connected to the sources and drains of the N-channel MOS transistors T1 to T4, respectively.

A circuit consisting of an inverter and an N-channel MOS transistor connected to the output terminal of the inverter will be referred to as "unit delay circuit" hereinafter. The capacity between the gate of each of the N-channel MOS transistors T1 to T4 and a back bias thereof is Cgb. The capacity between the gate and the source of the transistor is Cgs and that between the gate and the drain thereof is Cgd.

As shown in FIG. 4A, the selection circuit section 1 is provided with an FUSE circuit section 2 and a decoder circuit section 3.

The decoder circuit section 3 is provided with an NOR circuit 31 having the output terminal D1 an NOR circuit 32 having the output terminal D2, an NOR circuit 34 having the output terminal D3, an AND circuit 33 whose output signal is fed to one of the input terminals of the NOR circuit 34 and an inverter 35 having the output terminal D4.

The FUSE circuit 2 is provided with three FUSE blocks F1, F2 and F3. The output terminal A of the FUSE block F1 is connected to the input terminal of the NOR circuit 31 and that of the AND circuit 33. The output terminal B of the FUSE block F2 is connected to the input terminals of the NOR circuits 31 and 32 and that of the AND circuit 33. The output terminal c of the FUSE block F3 is connected to the input terminals of the NOR circuits 31, 32 and 34 and that of the inverter 35.

In the FUSE block F1, a switching element FUSE and an N-channel MOS transistor Q1 are connected in series between a power supply potential and a ground potential as shown in FIG. 5A. The block F1 is also provided with an inverter IV1 having an input terminal connected to the drain of the N-channel MOS transistor Q1 and the output terminal A connected to the gate of the N-channel less transistor Q1.

The other FUSE blocks F2 and F3 are constituted in the same manner as the FUSE block F1.

In the variable delay circuit in the first embodiment constituted as stated above, if the switching element FUSE in the FUSE block F1 is cut off, a high level signal is outputted from the block F1 and it the switching element FUSE is connected, a low level signal is outputted therefrom as indicated by FIG. 5B. Both the FUSE blocks F2 and F3 function in the same manner as the FUSE block F1.

Accordingly, at least signals "000 (LLL)", "001 (LLH)", "010 (LHL)", "011 (LEH)" and "100 (HLL)" are outputted from the output terminals "CBA" of the FUSS circuit section 2. These signals indicate the number M of the transistors among the N-channel MOS transistors T1 to T4 selected by the selection circuit section 1 in binary notation.

For example, if signals Sa, Sb and Sc outputted from the output terminals A, B and C are at levels L, L and L, the potentials of the output terminals D1, D2, D3 and D4 are at levels H, H, H and H, respectively. If signals Sa, Sb and Sc are at levels H, L and L, the potentials of the output terminals D1, D2, D3 and D4 are at levels L, H, H and H, respectively. If signals Sa, Sb and Sc are at levels L, H and L, the potentials of the output terminals D1, D2, D3 and D4 are at levels L, L, H and H, respectively. If at levels L, L and H, the potentials of the output terminals D1, D2, D3 and D4 are at levels L, L, L and L, respectively.

Therefore, if all of the potentials of the output terminals A, B and C are at low level (M=0), all of the potentials of the output terminals D1, D2, D3 and D4 of the decoder circuit section 3 are at high level. Due to this, the capacity of each of the N-channel MOS transistors T1 to T4 is only the capacity Cgb between the gate and back bias of the transistor.

The delay time $\tau 0$ of the unit delay circuit having the inverter I1 and the N-channel MOS transistor T1 in this case is represented by Mathematical Expression 1. In Expression 1, symbol R is the sum of the ON resistance of the inverter I1 and wiring resistance.

$$\tau 0 = R \times Cgb \tag{1}$$

Meanwhile, if the potentials of the output terminals A and B are at low level and that of the output terminal C is at high level (M=4), then all the potentials of the output terminals D1, D2, D3 and D4 of the decoder circuit section 3 are at low level. Therefore, the capacity of each of the N-channel MOS transistors T1 to T4 is the sum of the capacity Cgs between the gate and source of the transistor, the capacity Cgd between the gate and drain thereof and the capacity Cgb between the gate and back bias thereof.

The delay time $\tau 4$ of the unit delay circuit having the inverter I1 and the N-channel MOS transistor T1 in this case is represented by Mathematical Expression 2:

$$\tau 4 = R \times (Cgs + Cgd + Cgb) \quad (2).$$

Accordingly, the difference in the delay time of the unit delay circuit having the inverter I1 and N-channel MOS transistor T1 generated by switching the potentials of the source and drain of the N-channel MOS transistor T1 from high to low level is represented by Mathematical Expression 3:

$$\tau 4 - \tau 0 = R \times (Cgs + cgd) \quad (3).$$

According to a simulation, if the capacity Cgb is, for example, 0 (fF) and the capacities Cgs and Cgd are, for example, 8.6 (fF), then the difference in the delay time of the unit delay circuit is about 500 pico-seconds.

It is noted that the N-channel MOS transistors T1 to T4 may be either different or the same in size. Namely, it is possible to design the transistors in advance to have arbitrary sizes according to the state of the arrangement of circuits to be mounted.

For example, if the N-channel MOS transistor T1 is designed for 50-picosecond delay, the N-channel MOS transistor T2 is designed for 100-picosecond delay, the N-channel MOS transistor T3 is designed for 150-picosecond delay and the N-channel MOS transistor T4 is designed for 200-picosecond delay, then the following five types of delay amounts are obtained. It is noted that Cgbk (where symbol k is an integer from 1 to 4) is the capacity between the gate and back bias of the N-channel MOS transistor Tk, Cgsk is the capacity between the gate and source of the N-channel MOS transistor Tk and Cgdk is the capacity between the gate and drain thereof.

If the potentials of the output terminals D1, D2, D3 and D4 are at high level, delay time is represented by Mathematical Expression 4:

$$R \times (Cgb1 + Cgb2 + Cgb3 + Cgb4) \quad (4).$$

Thus, the delay time in this case is 0 pico-second.

If the potential of the output terminal D1 is at low level and those of the output terminals D2, D3 and D4 are at high level, delay time is represented by Mathematical Expression 5:

$$R \times \{(Cgb1 + Cgs1 + Cgd1) + (Cgb2 + Cgb3 + Cgb4)\} \quad (5).$$

Thus, delay time in this case is 50 pico-seconds.

If the potentials of the output terminals D1 and D2 are at low level and those of the output terminals D3 and D4 are at high level, delay time is represented by Mathematical expression 6:

$$R \times \{(Cgb1 + Cgs1 + Cgd1) + (Cgb2 + Cgs2 + Cgd2) + (Cgb3 + Cgb4)\} \quad (6).$$

Thus, delay time in this case is 150 pico-seconds.

It the potentials of the output terminals D1, D2 and D3 are at low level and that of the output terminal D4 is at high level, delay time is represented by Mathematical Expression 7:

$$R \times \{(Cgb1 + Cgs1 + Cgd1) + (Cgb2 + Cgs2 + Cgd2) + (Cgb3 + Cgs3 + Cgd3) + (Cgb4)\} \quad (7).$$

Thus, delay time in this case is 300 pico-seconds.

If the potentials of the output terminals D1, D2, D3 and D4 are at low level, delay time is represented by Mathematical Expression 8:

$$R \times \{(Cgb1 + Cgs1 + Cgd1) + (Cgb2 + Cgs2 + Cgd2) + (Cgb3 + Cgs3 + Cgd3) + (Cgb4 + Cgs4 + Cgd4)\} \quad (8).$$

Thus, delay time in this case is 500 pico-seconds.

In this embodiment, delay time is controlled by changing the potentials of the sources and drains, connected in common to the individual nodes, of the N-channel MOS transistors T1 to T4 as described above. It is, therefore, possible to greatly reducing the number of elements compared with the conventional variable delay circuit. As a result, a circuit requiring many delay circuit sections can be made small in size and the stability of the circuit enhances.

It is noted that P-channel MOS transistors instead of N-channel MOS transistors can be used.

Figure 6:
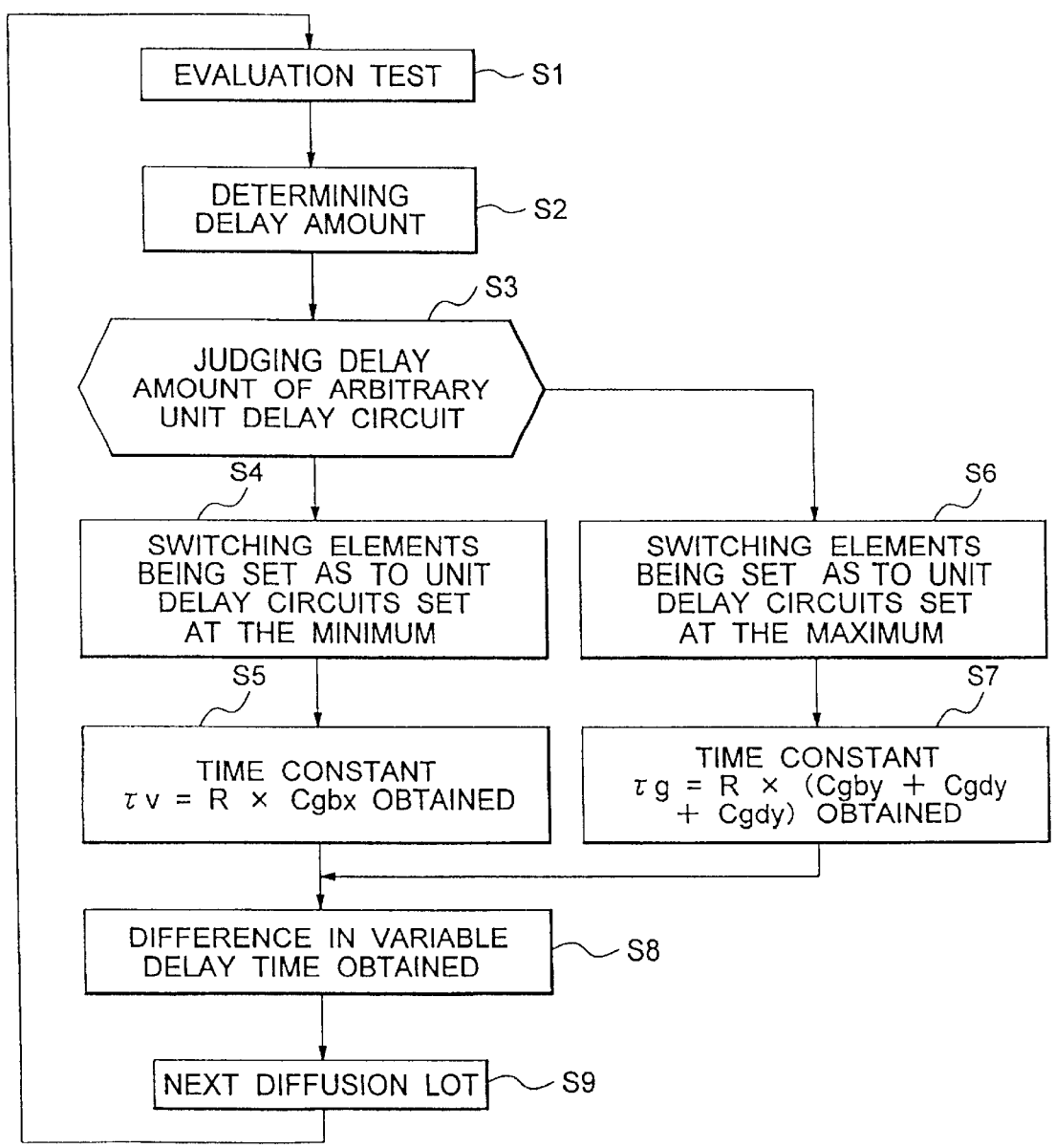
FIG. 6 is a flow chart showing a delay time setting method for the variable delay circuit in the first embodiment.

Next, description will be given to a method of setting the delay time of variable delay circuit constituted as stated above. FIG. 6 is a flow chart showing the delay time setting method for the variable delay circuit in the first embodiment according to the present invention.

First, an evaluation test for evaluating the characteristics necessary for a product is conducted to a semiconductor integrated circuit, in which a variable delay circuit in this embodiment is built, in a wafer state before enclosed in a predetermined package in manufacturing process (Step S1). In an evaluation test for, for example, an address signal or data input signal, a variable delay circuit is inserted into a signal transmission path and the signal is transmitted to a predetermined internal circuit.

If deficiency is discovered in the variation timing of the signal in the critical path of the internal circuit as a result of the characteristic evaluation, data on the result of the characteristic evaluation is examined to determine to what extent the delay amount of the variable delay circuit should be adjusted so that the circuit can function normally (Step S2).

Next, it is judged at which the delay amount of an arbitrary unit delay circuit is set, a lower value (a minimum value) or a higher value (a maximum value) (Step S3).

Next, as to the arbitrary unit delay circuits set at the minimum value of the delay amount, the switching elements in the FUSE blocks are set to be connected or non-connected so that the potential of the output terminal of the decoder circuit 3 corresponding to the unit delay circuits may become the power supply potential (Step S4).

On the other hand, as to the arbitrary unit delay circuits set at the maximum value of the delay amount, the switching elements in the FUSE blocks are set so that the potential of the output terminal of the decoder circuit 3 corresponding to the unit delay circuits may become the ground potential (Step S6).

It should be noted that the steps S4 and S6 are conducted at the same time. In a word, the FUSE blocks are set so that the two above-mentioned conditions should be satisfied.

As a result of the settings, decoding signals outputted from the decoder circuit section 3 causes the time constant τv of the unit delay circuits set at the minimum value of the delay amount to become R×Cgbx (Step S5). The decoding signals also causes the time constant τg of the unit delay circuits set at the maximum value of the delay amount to become R×(Cgby+Cgdy+Cgsy) (Step S7). Symbol Cgbx is the capacity between the gate and drain of an N-channel MOS transistor included in the unit delay circuits set at the minimum value of the delay amount. Symbol Cgby is the capacity between the gate and back bias of an N-channel MOS transistor included in the unit delay circuits set at the maximum value of the delay amount. Symbol Cgdy is the capacity between the gate and drain of an N-channel MOS transistor included in the unit delay circuits set at the maximum value of the delay amount. Symbol Cgsy is the capacity between the gate and source of an N-channel MOS transistor included in the unit delay circuits set at the maximum value of the delay amount.

As a result of these series of settings, the difference in variable delay time ((the sum of "τg"s)–(the sum of "τv"s)) is obtained (Step S8).

These steps are conducted for every diffusion lot (Step S9).

In the variable delay circuit having the delay time thus set, delay time corresponding to the minimum value and the maximum value, i.e., desired timing can be obtained by controlling the source potential and drain potential of the N-channel MOS transistor within a unit delay circuit for every lot.

Figure 7:
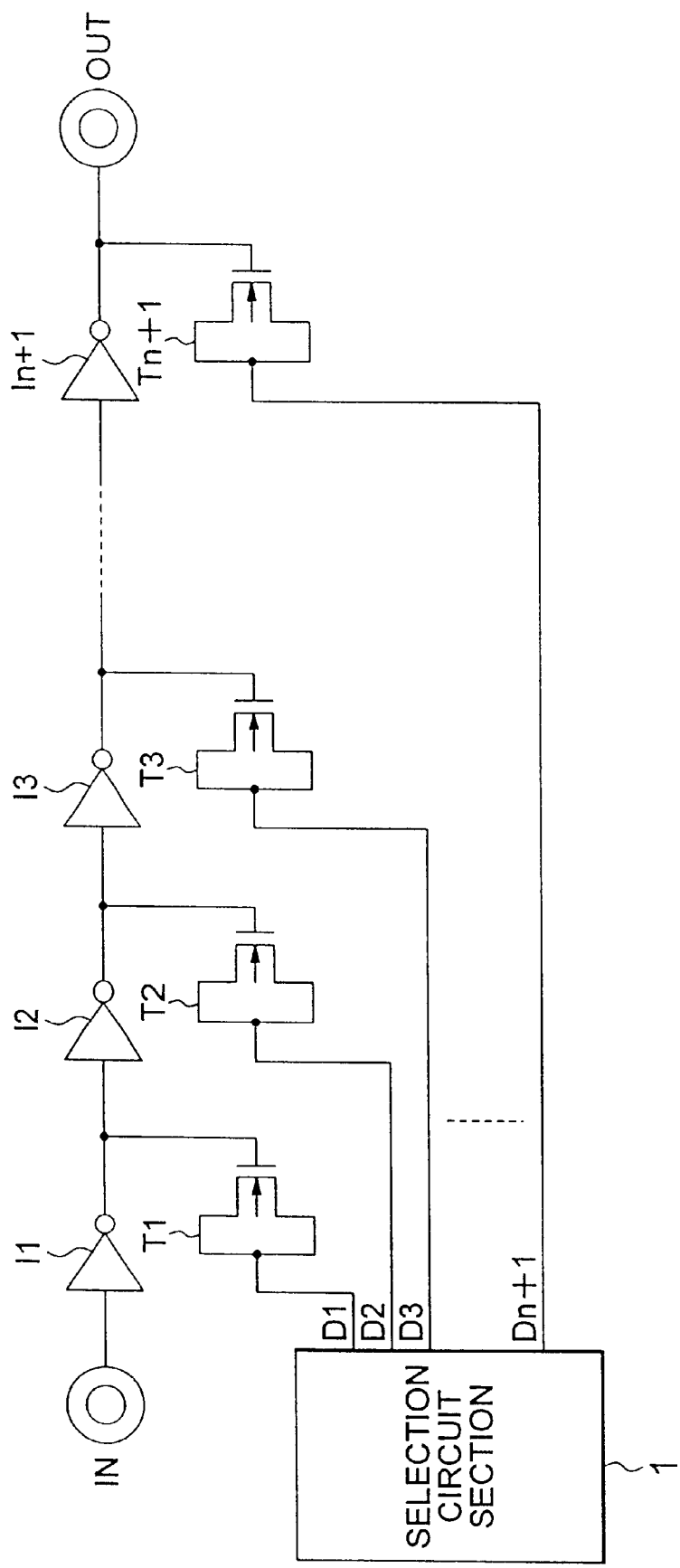
FIG. 7 is a circuit diagram showing an example of providing (n+1) unit delay circuits.

In the first embodiment, the number of unit delay circuits is four. The present invention should not be, however, limited to the number. FIG. 7 is a circuit diagram showing an example of providing (n+1) unit delay circuits. As shown therein, if (n+1) unit delay circuits are provided, the number of output terminals of the selection circuit section 1 are (n+1), as well. Also, an FUSE circuit section (not shown) having output terminals as many as binary digits indicating the number of N-channel MOS transistors T1 to Tn+1 is provided in the selection circuit section 1. A decoder circuit section (not shown) decoding the output signals of the FUSE circuit section to (n+1) types of signals, is also provided in the selection circuit section 1.

Figure 8:
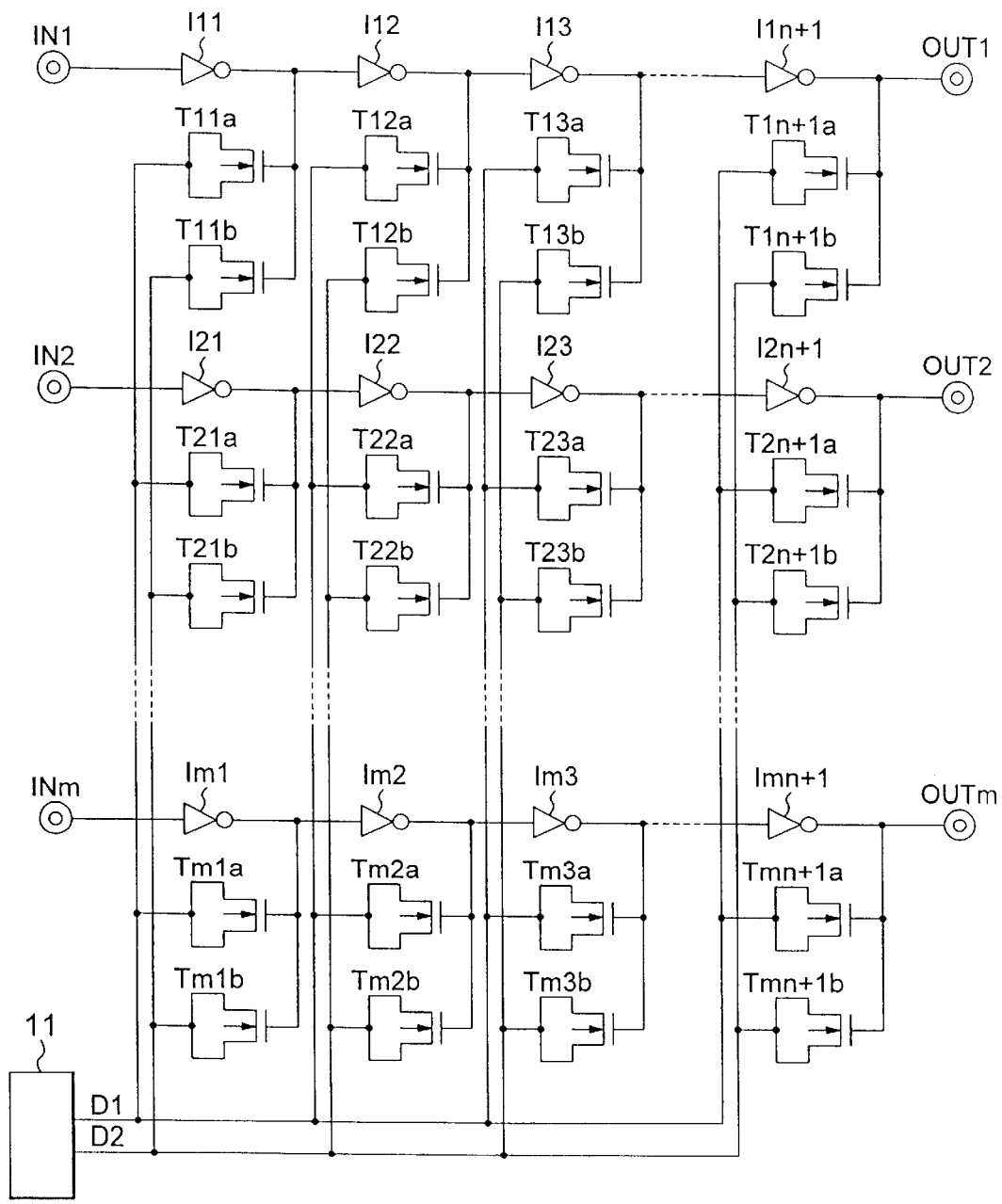
FIG. 8 is a circuit diagram showing a variable delay circuit in the second embodiment according to the present invention.
Figures 9A, 9B:
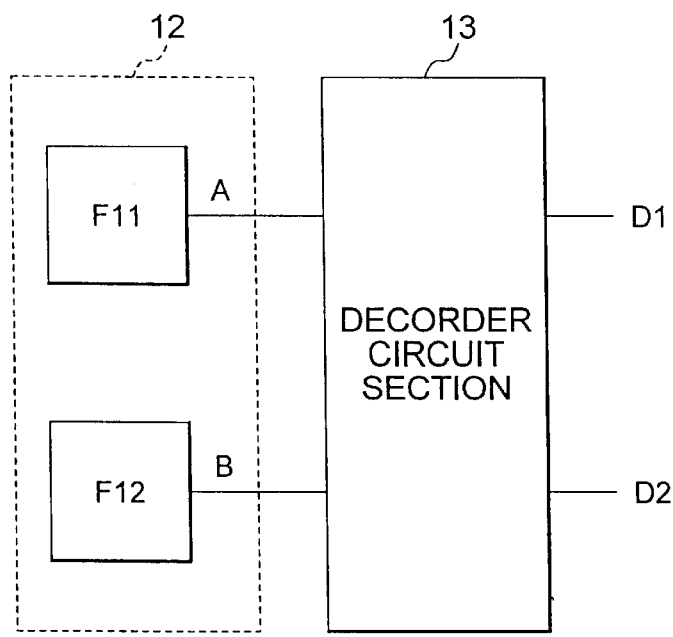
FIG. 9A is a block diagram showing a selection circuit section 11 and FIG. 9B shows a truth table for the selection circuit section 11.

Next, the second embodiment of the present invention will be described. FIG. 8 is a circuit diagram showing a variable delay circuit in the second embodiment according to the present invention. FIG. 9A is a block diagram showing a selection circuit section 11 and FIG. 9B is a truth table for the selection circuit section 11.

In the second embodiment, (n+1) inverters I11, I12, I13, ... and I1n+1 having mutually equal propagation delay time are connected in series between the first input terminal IN1 and the first output terminal OUT1. Each of the inverters I11, I12, I13, ... and I1n+1 consists of, for example, a CMOS transistor. The gates of the first N-channel MOS transistors T11$a$, T12$a$, T13$a$, ... and T1n+1 a and those of the second N-channel MOS transistors T11$b$, T12$b$, T13$b$, ... and T1n+1 b are connected to the nodes between adjacent inverters or between the inverter I1n+1 and the output terminal OUT1, respectively. The sources and drains of the N-channel MOS transistors T11$a$ to T1n+1 a and T11$b$ to T1n+1 b are connected in common to nodes, respectively.

Likewise, (n+1) inverters I21, I22, I23, ... and I2n+1 having mutually equal propagation delay time are connected in series between the second input terminal IN2 and the second output terminal OUT2. The gates of the first N-channel MOS transistors T21$a$, T22$a$, T23$a$, ... and T2n+1 and those of the second N-channel MOS transistors T21$b$, T22$b$, T23$b$, and T2n+1 b are connected to the nodes between adjacent inverters or between the inverter I2n+1 and the output terminal 0UT2, respectively. The sources and drains of the N-channel MOS transistors T21$a$ to T2n+1 a and T21$b$ to T2n+1 b are connected in common to nodes, respectively.

m input terminals and m output terminals are provided and (n+1) inverters Im1, Im2, Im3, ... and Imn+1 having mutually equal propagation delay time are connected in series between the m-th input terminal INm and the m-th output terminal OUTm. The gates of the first N-channel MOS transistors Tm1$a$, Tm2$a$, Tm3$a$, ... and Tmn+1 a and those of the second N-channel MOS transistors Tm1$b$, Tm2$b$, Tm3$b$, ... and Tmn+1 b are connected to the nodes between adjacent inverters or between the inverter Ima+1 and the output terminal OUTm, respectively. The sources and drains of the N-channel MOS transistors Tm1$a$ to Tmn+1 a and Tm1$b$ to Tmn+1 b are connected in common to nodes, respectively.

The variable delay circuit is also provided with a selection circuit section 11 having output terminals D1 and D2. The output terminal D1 is connected to all of the first N-channel MOS transistors and the output terminals D2 is connected to all of the second N-channel MOS transistors.

As shown in FIG. 9A, the circuit selection section 11 is provided with an FUSE circuit section 12 and a decoder circuit section 13, The FUSE circuit section 12 is provided with two FUSE blocks F11 and F12. The FUSE blocks F11 and F12 are constituted in the same manner as the FUSE block F1 and the like in the first embodiment.

In the second embodiment constituted as stated above, signals "00 (LL)", "01 (LH)", "10 (HL)" and "11 (HH)" are outputted from the output terminals "BA" of the FUSE circuit section 12. If the potentials of the output terminals A and B are at low levels L and L, those of the output terminals D1 and D2 are at high levels H and H, respectively, as indicated by FIG. 9B. If the potentials of the output terminals A and B are at levels H and L, those of the output terminals D1 and D2 are at levels L and H, respectively. If the potentials of the output terminals A and B are at levels L and H, those of the output terminals D1 and D2 are at levels H and L, respectively. If the potentials of the output terminals A and B are at levels H and H, those of the output terminals D1 and D2 are at levels L and L, respectively.

It is noted that the N-channel MOS transistors T11$a$ to T1n+1 a and T11$b$ to T1n+1 b may be either different or the same in size. Namely, it is possible to design the transistors in advance to have arbitrary sizes according to the state of the arrange of circuits to be mounted, For example, if the N-channel MOS transistor T11$a$ is designed for 50-picosecond delay and the N-channel MOS transistor T11b is designed for 100-picosecond delay, the following four types of delay amounts are obtained.

If the potentials of the output terminals D1 and D2 are at high level, delay time is represented by Mathematical Expression 9:

$$R\times(\text{cgb11a}+\text{Cgb11b}) \qquad (9).$$

Thus, delay time in this case is 0 pico-second.

If the potential of the output terminal D1 is at low level and that of the output terminal D2 is at high level, delay time is represented by Mathematical Expression 10:

$$R\times\{(\text{Cgb11a}+\text{Cgs11a}+\text{Cgd11a})+\text{Cgb11b}\} \qquad (10).$$

Thus, delay time in this case is 50 pico-seconds.

If the potential of the output terminal D1 is at high level and that of the output terminal D2 is at low level, delay time is represented by Mathematical Expression 11:

$$R\times\{(\text{Cgb11a}+(\text{Cgb11b}+\text{Cgs11b}+\text{Cgd11b}\} \qquad (11).$$

Thus, delay time in this case is 100 pico-seconds.

If the potentials of the output terminals D1 and D2 are at low level, delay time is represented by Mathematical Expression 12:

$$R\times\{(\text{Cgb11a}+\text{Cgs11a}+\text{Cgd11a})+(\text{Cgb11b}+\text{Cgs11b}+\text{Cgd11b})\} \quad (12).$$

Thus, delay time in this case is 300 pico-seconds.

In this embodiment, the delay time of the respective systems of the output terminals OUT1, OUT2, ... and OUTm can be adjusted arbitrarily and minutely by the combination of a plurality of unit variable delay circuits.

In the second embodiment, two transistors are provided in a unit delay circuit. Three or more transistors may be provided therein. In the latter case, the number of controlling signals outputted from the selection circuit section may be matched to the number of the transistors. By doing so, delay time can be adjusted far more minutely.

On the other hand, if the strict adjustment of delay time is not necessary, the second N-channel MOS transistors and the output terminal D2 may not be provided. Even if the variable delay circuit is so constituted, it is possible to arbitrarily adjust the delay time of the respective systems of the output terminals OUT1, OUT2, . . . and OUTm.

The second embodiment is suited for a case where a plurality of variable delay signals exist and the plurality of signals are delayed simultaneously by the same time.

Moreover, in the second embodiment as in the case of the first embodiment, P-channel MOS transistors instead of the N-channel MOS transistors may be used.

What is claimed is:

1. A variable delay circuit comprising:
   a plurality of unit delay circuits connected in series, each of said plurality of unit delay circuits including:
   an inverter; and
   a transistor having a current control electrode connected to an output terminal of said inverter said transistor generating a first delay and a second delay relating to a signal supplied to another electrode, said second delay being larger than said first delay; and
   a selection control circuit which selects a signal applied to said another electrode of each of a plurality of said transistors.

2. The variable delay circuit according to claim 1, wherein said transistor has two electrodes other than said current control electrode connected in common to a node.

3. The variable delay circuit according to claim 1, wherein said first delay is related to a capacity between a gate and a back bias and said second delay is related to a capacity between the gate and a source, and a capacity between the gate and drain.

4. The variable delay circuit according to claim 1, wherein said transistor is one of an N-channel MOS transistor and a P-channel MOS transistor.

5. The variable delay circuit according to claim 2, wherein said selection control circuit includes;
   a switching element; and
   a decoder circuit which decode a connected/non-connected state of said switching element, said decoder circuit outputting a signal to the common connection node of at least one transistor.

6. The variable delay circuit according to claim 5, wherein said transistor, to which an output signal of said decoder circuit is inputted, generates said first delay when a logic level of said output signal is high and generates said second delay when said logic level is low.

7. The variable delay circuit according to claim 1, wherein
   a plurality of said inverters of said plurality of unit delay circuits have substantially same propagation delay time;
   a plurality of said transistor of said plurality of unit delay circuits are N-channel MOS transistors;
   sources and drains of said N-channel MOS transistors are connected in common to nodes, respectively;
   said selection control circuit has:
      a switching circuit provided with output terminals at least as many as binary digits indicating the number of said plurality of unit delay circuits; and
      a decoder circuit which decodes output signals of said switching circuit to signals at least as many as said plurality of unit delay circuits; and
   nodes to which said sources and drains are connected in common are connected to a plurality of output terminals provided at said selection control circuit, respectively.

8. A variable delay circuit comprising:
   a plurality of unit delay circuits connected in series, each of said plurality of unit delay circuits including:
   an inverter; and
   a plurality of variable capacity elements connected to an output terminal of said inverter, each of said variable capacity elements generating a first delay and a second delay relating to a capacitive variation, said second delay being larger than said first delay; and
   a control circuit which controls capacities of a plurality of said variable capacity elements.

9. The variable delay circuit according to claim 8, wherein
   a plurality of unit delay circuit groups each consisting of said plurality of unit delay circuits connected in series to one another are provided; and
   unit delay circuits provided at corresponding positions of said unit delay circuit groups are controlled by said control circuit in a same manner.

10. The variable delay circuit according to claim 8, wherein
   a plurality of said inverters of said plurality of unit delay circuits have substantially same propagation delay time;
   said plurality of variable capacity elements have N-channel MOS transistors, respectively;
   sources and drains of said N-channel MOS transistors are connected in common to nodes, respectively;
   said selection control circuit has;
      a switching circuit provided with output terminals at least as many as binary digits indicating the number of said variable capacity elements in said unit delay circuits; and
      a decoder circuit which decodes output signals of said switching circuit to signals at least as many as said capacitive variable elements in said unit delay circuits; and
   nodes to which said sources and drains are connected in common are connected to a plurality of output terminals provided at said selection control circuit, respectively.

11. A time delay setting method for a variable delay circuit, said variable delay circuit comprising:
   a plurality of unit delay circuits connected in series, each of said plurality of unit delay circuits including:
   an inverter, and
   a transistor having a current control electrode connected to an output terminal of said inverter and two electrodes other than said current control electrode connected in common to a node, said transistor generating a first delay and a second delay relating to a signal supplied to another electrode, said second delay being larger than said first delay, and
   a selection control circuit which selects a signal applied to said another electrode of each of a plurality of said transistors and includes:
   a switching element, and
      a decoder circuit which decodes a connected/non-connected state of said switching element, said decoder circuit outputting a signal to said common connection node of at least one transistor;

said time delay setting method comprising the steps of:
conducting a test for a circuit including said variable delay circuit;

setting a delay amount of each of said unit delay circuits based on a result of said test, the step including the step of setting said switching elements so that different potentials from each other are supplied to said common connection node in a unit delay circuit whose delay amount has been set to said first delay and to said common connection node in a unit delay circuit whose delay amount has been set to said second delay.

\* \* \* \* \*